United States Patent
Ferchland et al.

(10) Patent No.: US 8,030,963 B2
(45) Date of Patent: Oct. 4, 2011

(54) INTEGRATED CIRCUIT AND STANDARD CELL FOR AN INTEGRATED CIRCUIT

(75) Inventors: Tilo Ferchland, Dresden (DE);
Thorsten Riedel, Dresden (DE);
Matthias Vorwerk, Dresden (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/817,709

(22) Filed: Jun. 17, 2010

(65) Prior Publication Data

US 2010/0321063 A1    Dec. 23, 2010

Related U.S. Application Data

(60) Provisional application No. 61/218,219, filed on Jun. 18, 2009.

(30) Foreign Application Priority Data

Jun. 18, 2009   (DE) .......................... 10 2009 029 784

(51) Int. Cl.
*G06F 7/50*    (2006.01)
*H03K 19/21*    (2006.01)
*H03K 19/20*    (2006.01)

(52) U.S. Cl. ......................................... 326/52; 326/104
(58) Field of Classification Search .................... 326/52, 326/93, 112, 119
See application file for complete search history.

(56) References Cited

U.S. PATENT DOCUMENTS

| 6,453,431 | B1 | 9/2002 | Bernstein et al. |
| 2004/0243893 | A1 | 12/2004 | Mudge et al. |
| 2006/0220716 | A1 * | 10/2006 | Nicolaidis ..................... 327/199 |

OTHER PUBLICATIONS

U. Tietze and CH. Schenk, "Semiconductor Technology", $12^{th}$ edition, 2002, pp. 675 to 681.
R. J. Baker et al., "CMOS—Circuit Design", Layout, and Simulation ,IEEE Press, 1998, p. 270 and p. 291.

* cited by examiner

*Primary Examiner* — Shawki Ismail
*Assistant Examiner* — Dylan White
(74) *Attorney, Agent, or Firm* — Baker Botts L.L.P.

(57) ABSTRACT

In one embodiment, a cell of an integrated circuit includes a master-slave flip-flop and comparator logic having inputs adapted to receive an input signal of the master-slave flip-flop, an inverted input signal of the master-slave flip-flop, an output signal of the master-slave flip-flop, and an inverted output signal of the master-slave flip-flop. The master-slave flip-flop comprises a master flip-flop and a slave flip-flop. The slave flip-flop includes a first inverting element and a second inverting element. An output of the first inverting element is connectable to an input of the second inverting element and an output of the second inverting element to an input of the first inverting element. To output the output signal and the inverted output signal of the master-slave flip-flop, the output and the input of the second inverting element are connectable to the inputs of the comparator logic.

8 Claims, 2 Drawing Sheets

INTEGRATED CIRCUIT AND STANDARD CELL FOR AN INTEGRATED CIRCUIT

This nonprovisional application claims priority to German Patent Application No. DE 10 2009 029 784.7, which was filed in Germany on Jun. 18, 2009, and to U.S. Provisional Application No. 61/218,219, which was filed on Jun. 18, 2009, and which are both herein incorporated by reference.

BACKGROUND OF THE INVENTION

1. Field of the Invention

The present invention relates to an integrated circuit and a standard cell of an integrated circuit.

2. Description of the Background Art

Sequential circuits for performing logic operations with the additional ability to store individual variable states are known from U. Tietze and Ch. Schenk, "Halbleiterschaltungstechnik" (Semiconductor Technology), $12^{th}$ edition, 2002, pages 675 to 681. For integrated circuits, flip-flops are provided which are subdivided into transparent flip-flops and flip-flops with buffer storage. A master-slave flip-flop with a master flip-flop (master) and a slave flip-flop (slave) can be provided for buffer storage. It can be formed as a two-edge-triggered flip-flop. The flip-flops can be realized, for example, with inverters, NAND gates, or NOR gates as feedback inverting elements.

An edge-triggered D flip-flop as an implementation with transmission gates is known from "CMOS—Circuit Design, Layout, and Simulation," R. J. Baker et al., IEEE PRESS, 1998, page 270. A D flip-flop can be, for example, a standard cell, as is described on page 291. Standard cells are designed for a manufacturing process and measured and characterized with suitable test structures even before the startup of mass production. Thereby, the complete circuit properties of the cell over the planned operating range (voltage, temperature) are determined and transformed into suitable simulation models. A plurality of cells is combined in this regard into a cell library.

SUMMARY OF THE INVENTION

It is therefore an object of the present invention to improve a standard cell as much as possible. Accordingly, a standard cell of a monolithically integrated circuit is provided.

The standard cell can have a master-slave flip-flop. Preferably, the master-slave flip-flop is a master-slave D flip-flop.

The standard cell has a comparator logic. The comparator logic is formed to compare the input signal and output signal of the master-slave flip-flop with one another. Preferably, if there is a difference between the input signal and output signal, a corresponding comparison signal is output. The comparison signal can be used, for example, for relaying a clock signal.

The standard cell can have an exclusive-OR function. The logic definition of the exclusive-OR function is that a high signal is output at the output only when both inputs for non-inverted signals (and thereby also both inputs for inverted signals) have a different input potential.

The non-inverted input signal of the master-slave flip-flop, the inverted input signal of the master-slave flip-flop, the non-inverted output signal of the master-slave flip-flop, and the inverted output signal of the master-slave flip-flop are present at the inputs of the comparator logic. All signals present at the inputs of the comparator logic are logically linked with one another. Preferably, the logic operation by the comparator logic causes a comparison of the input and output signals of the master-slave flip-flop.

The master-slave flip-flop has a master flip-flop and a slave flip-flop. The slave flip-flop has a first inverting element and a second inverting element. The first inverting element and/or the second inverting element are, for example, a NAND gate, a NOR gate, or an inverter.

For feedback, an output of the first inverting element is connected to an input of the second inverting element and an output of the second inverting element to an input of the first inverting element. Preferably, the output of the second inverting element is connected to the input of the first inverting element via a transmission gate for coupling and decoupling.

To output the output signal and the inverted output signal of the master-slave flip-flop, it is possible to connect the output and the input of the second inverting element to the inputs of the comparator logic, so that the second inverting element and the comparator logic and an inverter 185 form an exclusive-OR operation of the standard cell.

The object of the invention, further, is to provide as improved an integrated circuit as possible. Accordingly, an integrated circuit is provided. The integrated circuit has at least one previously described standard cell, preferably, however, a plurality of these standard cells. The standard cells can be connected to a clock distribution structure (clock tree).

The integrated circuit has a clock gate circuit (clock gate) and a clock switching logic.

An output, connected to the comparator logic, of the standard cell to output a comparison signal in the case of different input and output signals of the master-slave flip-flop is connected to an input of the clock switching logic.

The output of the clock switching logic is connected to a control input of the clock gate circuit to switch a clock to a clock input of the standard cell based on the comparison signal.

By means of this clock switching functionality, the standard cell is not clocked when its state would not change in any event. Each applied clock, however, leads to a displacement current due to parasitic capacitances of the transistors, so that the power consumption by the clock switching can be reduced.

Another aspect of the invention is a use of a previously described integrated circuit or a previously described standard cell for a battery-operated circuit. The battery-operated circuit is formed preferably for a radio network, preferably according to the industry standard IEEE 802.15.4 or another industry standard (WLAN, Bluetooth, WiMax).

The embodiments described hereinafter refer to both the standard cell and to the integrated circuit, as well as to the use.

In an embodiment, the standard cell can have a multiplexer, whose output is bonded to an input of the master-slave flip-flop and preferably to an input of the comparator logic.

According to an embodiment, the comparator logic can have an output to output a comparison signal. The output of the comparator logic is connected to an output of the standard cell. The multiplexer makes it possible for the purposes of operation and testing to switch several inputs of the standard cell to the input of the master-slave flip-flop, it being possible to output a comparison signal by means of the comparator logic for all switching positions.

In an embodiment, the standard cell can have an output driver, which is connected to the slave flip-flop and a data output of the standard cell. The output driver is formed, for example, as an inverter.

The integrated circuit can be formed to perform a test function. Preferably, for this purpose, the standard cell has a test input and a data input. The standard cell for this purpose, furthermore, has a multiplexer connected to the test input and to the data input for switching to the test input for the test function. The output of the multiplexer is connected, preferably bonded, to an input of the master-slave flip-flop and an input of the comparator logic.

In an embodiment, the comparator logic represents: a first OR operation, whose inputs are connected to the inputs of the comparator logic; and a second OR operation, whose inputs are connected to the inputs of the comparator logic; and a NAND operation, whose inputs are connected to the output of the first OR operation and to the output of the second OR operation and whose output is connected to an output of the comparator logic.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
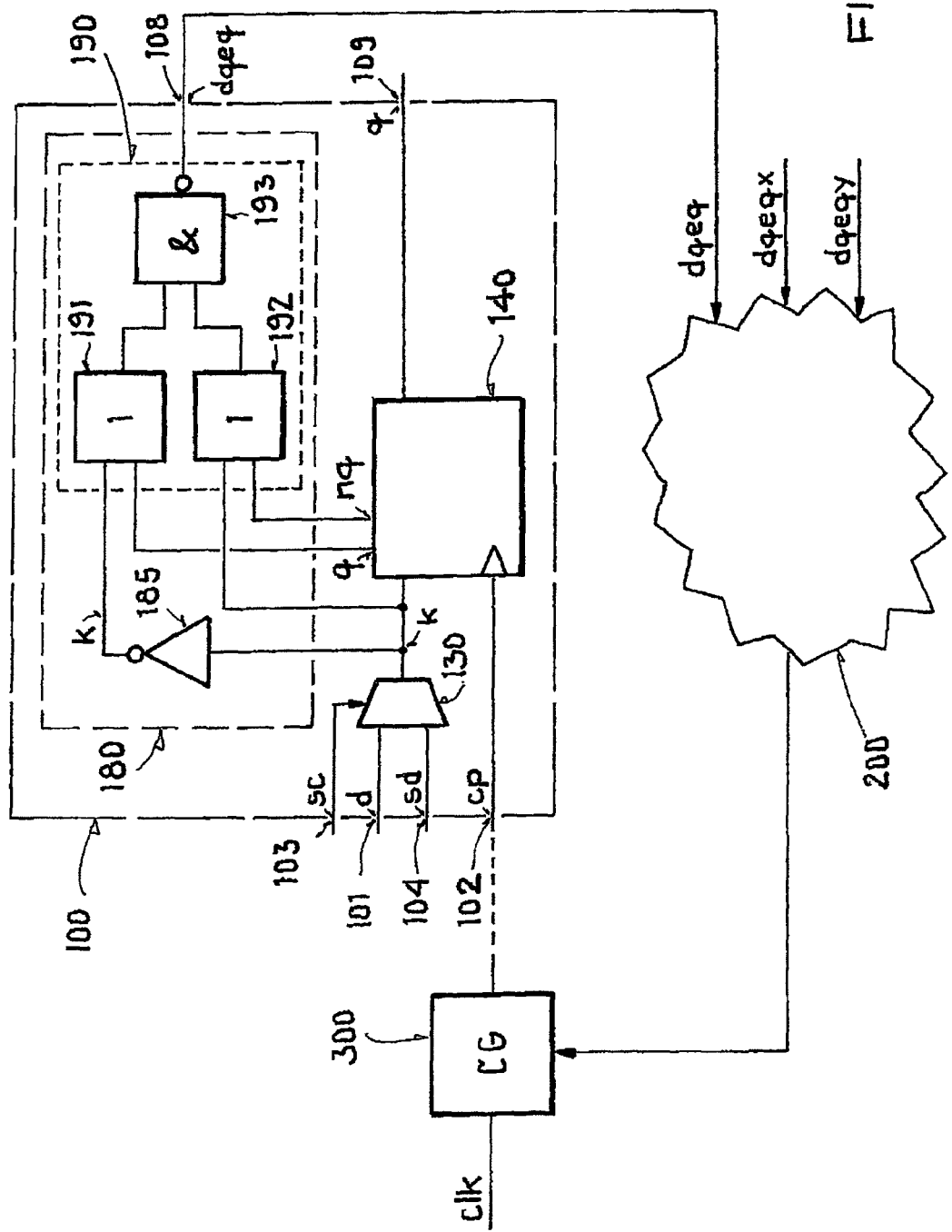
FIG. 1 shows a schematic block diagram.

A standard cell 100 of an integrated circuit is shown schematically in FIG. 1. Standard cell 100 has a master-slave flip-flop 140, whose output is connected to an output 109 of standard cell 100 to output the data signal q. The master-slave flip-flop is formed, for example, as a D flip-flop, JK flip-flop, or RS flip-flop. The circuit of FIG. 1 will be described below by way of example with a master-slave D flip-flop 140. The clock input of the master-slave D flip-flop 140 is connected to a clock input 102 of standard cell 100. The data input of the master-slave D flip-flop 140 is connected via a multiplexer 130 to the data input 101 of standard cell 100 for the input data d.

Moreover, standard cell 100 has an evaluation logic 180 with a comparator logic 190. There are four signals at the inputs of the comparator logic 190: the input signal k of the master-slave D flip-flop 140, the inverted input signal nk of the master-slave D flip-flop 140, the output signal q of the master-slave D flip-flop 140, and the inverted output signal nq of the master-slave D flip-flop 140. In the exemplary embodiment of FIG. 1, the inverted input signal nk of the master-slave D flip-flop 140 is formed by inverter 185.

The comparator logic 190 is shown schematically in its logic function by the two OR gates 191, 192 and the NAND gate 193, whereby for implementation individual gates are not used but a transistor logic. The comparator logic 190 in this regard causes a first ORing of the (non-inverted) input signal k and of the inverted output signal nq of the master-slave D flip-flop 140 and a second ORing of the inverted input signal nk and of the (non-inverted) output signal q of the master-slave D flip-flop 140.

Figure 2:
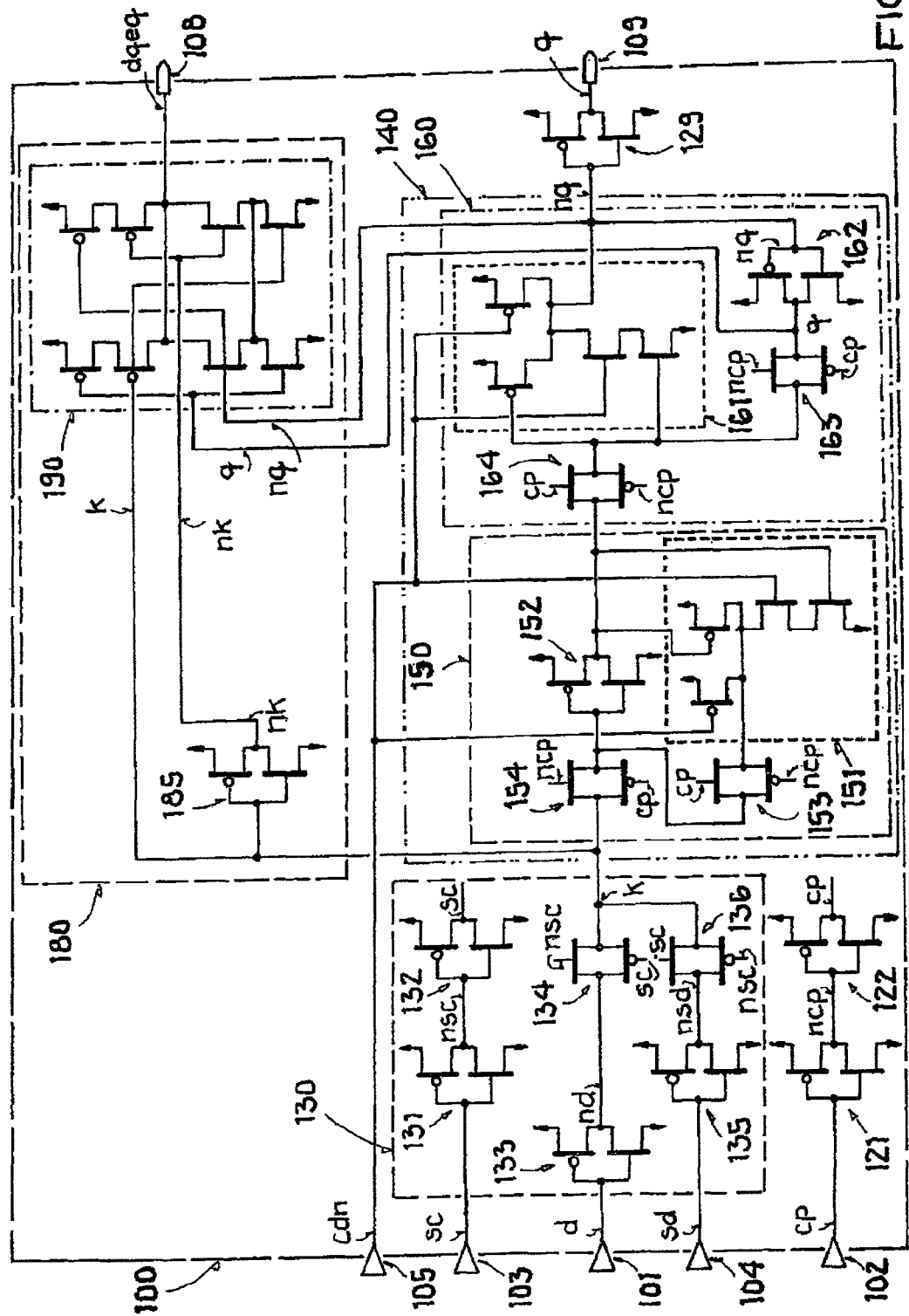
FIG. 2 shows a circuit diagram of a standard cell.

The comparison signal dqeq formed by the comparator logic 190 is output at output 108 of standard cell 100. From output 108, the comparison signal dqeq reaches a logic 200 which is connected to a control input of a clock gate circuit 300 (clock gate). Logic 200 and clock gate circuit 300 are an especially simplified depiction of a part of a clock tree structure (clock tree) to control the clock relaying to the register or flip-flop, such as that of the depicted standard cell 100. The clock gate circuit 300 in the case of a difference between the input signal k and the output signal q connects through a clock clk to the clock input 102 of standard cell 100. The view in FIG. 2 is greatly simplified. Several flip-flops can be bonded to clock gate circuit 300 (indicated by the dashed line) (different from FIG. 2). Likewise, a plurality of comparison signals dqeq, dqeqx, dqeqy of several standard cells 100 can be evaluated by logic 200.

The circuit in FIG. 1 is formed, moreover, for test functions. For the test functions, the input of the master-slave D flip-flop 140 can be switched by multiplexer 130 of standard cell 100 to a test input 104 for the test signal sd. The switching occurs by means of the selection signal sc at the selection input 103. Because of the integration of evaluation circuit 180 together with the master-slave D flip-flop 140 and multiplexer 130 in a standard cell, the profound effect is achieved that the comparison function can be used by means of the comparator logic 190 without additional cost also in a test mode and thereby the so-called clock gating can also be included in the testing.

An exemplary embodiment of a standard cell 100 is shown in detail in FIG. 2. The standard cell 100 of FIG. 2 for the following explanations in this regard should show the same functionality as the standard cell 100 of FIG. 1. The signals in a master-slave D flip-flop 140 are inverted versus FIG. 1 by inverters 133, 135 at input 101, 104 and an inverter 129 at output 109. Inverter 129 at the output is designed to drive higher currents. The input inverters 133, 135 are formed with an especially low input capacitance.

FIG. 2 shows an implementation of a standard cell 100 with inverters 121, 122, 129, 131, 132, 133, 135, 152, 162, 185, transmission gates 134, 136, 153, 154, 163, NAND gates 151, 161, and the comparator logic 190. The exemplary embodiment of FIG. 2 shows how the comparator logic 190 can be implemented especially simply by eight transistors.

The master-slave D flip-flop 140 has a master flip-flop 150 and a slave flip-flop 160. The slave flip-flop 160 has the NAND gate 161 as the first inverting element 161 and the inverter 162 as the second inverting element 162. The first inverting element 161 and the second inverting element 162 are fed back in this regard. For the feedback, an output of the first inverting element 161 is connected to an input of the second inverting element 162 and an output of the second inverting element 162 to an input of the first inverting element 161. Instead of the employed inverter 162 and NAND gate 161, in contrast to the exemplary embodiment of FIG. 2, other inverting elements, such as, for example, NOR gates, may also be used. The master flip-flop also has two fed-back inverting elements 151, 152 as NAND gate 151 or inverter 152.

The output and the input of the second inverting element 162 are bonded to the inputs of the comparator logic 190. Accordingly, the (non-inverted) output signal q and the inverted output signal nq need not be generated in addition, but provided within standard cell 100 itself by the master-slave D flip-flop 140 and in each case output to an input of the comparator logic 190. The wiring of the transistors in this regard can be realized especially simply and with very short routes within standard cell 100. The second inverting element 162 and comparator logic 190 and an inverter 185 form an exclusive-OR operation of standard cell 100. The exclusive-OR function is therefore integrated into standard cell 100 itself, so that no additional exclusive-OR gate is needed in addition to standard cell 100. In this regard, the technical synergy effect is utilized that the second inverting element 162 is used in a dual function as a component of the slave D flip-flop and as an inverter for generating the input signal of comparator logic 190 to form the exclusive-OR operation. In one embodiment, the comparator logic 190 receives signals from the second inverting element 162 and inverter 185 to perform an exclusive-OR function. For example, if both the input signal k and the output signal q of the master-slave D flip-flop 140 are low, the output signal dqeq of the comparator logic 190 is high. Table 1 below is an example truth table showing the state of the output signal dqeq of the comparator logic 190 corresponding to various states of input signal k and output signal q transmitted to the comparator logic 190.

TABLE 1

| Input | | Output |
|---|---|---|
| k | q | dqeq |
| 0 | 0 | 0 |
| 0 | 1 | 1 |
| 1 | 0 | 1 |
| 1 | 1 | 0 |

The master-slave D flip-flop 140 has four transmission gates 153, 154, 163, 164 overall, which are controlled by the switched clock signal cp and the inverted switched clock signal ncp. The switched clock signal cp and the inverted switched clock signal ncp are provided by the two inverters 121 and 122, whereby the connections to the transmission gates 153, 154, 163, 164 are not shown in FIG. 2 for the sake of better clarity.

Multiplexer 130 also has transmission gates 134, 136 as switching elements. Transmission gates 134, 136 of multiplexer 130 are controlled by the selection signal sc and the inverted selection signal nsc, which are formed by inverters 131, 132. The connections between transmission gates 134, 136 and inverters 131, 132 of multiplexer 130 are also not shown in FIG. 2 for the sake of better clarity.

The input 105 of standard cell 100 enables the resetting of the master-slave D flip-flop 140. If the reset signal cdn is present at input 105 at a low potential, the output of the NAND gate 161 is reset to high, and thereby the output of the standard cell to LOW. A high potential at input 105, in contrast, does not influence the function of the master-slave D flip-flop 140.

The evaluation circuit 180 has at its input an inverter 185, which inverts the input signal k of the master-slave D flip-flop 140 to an inverted input signal nk. Alternatively, the inverted input signal nk can also be formed by an inverter of multiplexer 130 or by an inverter of the master flip-flop 150 with dual use, which is not shown in FIG. 2, however.

The input signal k of the master-slave D flip-flop 140, the input signal nk, inverted by inverter 185, of the master-slave D flip-flop 140, the non-inverted output signal q, formed by inverting element 162, of the master-slave D flip-flop 140, and the inverted output signal nq of the master-slave D flip-flop 140 are therefore present at the comparator logic 190. To this end, the comparator logic 190 is connected by two terminals directly to slave flip-flop 160.

The first OR function of the comparator logic 190 is formed by the two NMOS transistors with a parallel drain-source path and the second OR function is formed by two additional NMOS transistors with a parallel drain-source path. Both pairs are connected in series for the NAND function. The PMOS transistors are accordingly complementary in terms of logic.

The power consumption can be reduced considerably by standard cell 100 compared with an implementation with a majority of single cells. In addition, compared with single cells, considerable area (10%-20%) can be saved and the driver strength can be better optimized. The standard cell 100 according to FIG. 2 realizes a clock- or event-based memory cell (e.g., D-FF). The standard cell 100 is designed so that the memory cell only requires a change event when the on and off states do not agree. The comparison using a bit-wide memory cell is realized by the comparator logic 190 in lieu of an XOR gate. Compared with a pure flip-flop standard cell, standard cell 100 according to FIG. 2 obtains an additional output 108 which outputs a comparison result between input signal k, nk and output signal q, nq as a comparison signal dqeq. For a test mode of the cell (scan flip-flop), the comparison function can be used so that in the test mode (scan mode) the comparison between input and output is sufficient to require the clock for the standard cell 100.

The invention is not limited to the shown embodiment variants in FIGS. 1 and 2. For example, it is possible to use another type of master-slave flip-flop. It is also possible to use other inverting elements, such as NOR gates. The functionality of the standard cell 100 according to FIG. 2 can be used especially advantageously for a battery-operated radio system.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A standard cell of an integrated circuit, the cell comprising:
   a master-slave flip-flop; and
   a comparator logic having inputs adapted to receive an input signal of the master-slave flip-flop, an inverted input signal of the master-slave flip-flop, an output signal of the master-slave flip-flop, and an inverted output signal of the master-slave flip-flop,
   wherein the master-slave flip-flop has a master flip-flop and a slave flip-flop,
   wherein the slave flip-flop has a first inverting element and a second inverting element,
   wherein, for feedback, an output of the first inverting element is connectable to an input of the second inverting element and an output of the second inverting element is connectable to an input of the first inverting element, and
   wherein, to output the output signal and the inverted output signal of the master-slave flip-flop, the output and the input of the second inverting element are connectable to inputs of the comparator logic so that the second inverting element and the comparator logic and an additional inverter form an exclusive-OR operation of the standard cell.

2. The standard cell according to claim 1, further comprising a multiplexer having an output connected to an input of the master-slave flip-flop.

3. The standard cell according to claim 1, further comprising a multiplexer having an output connected to an input of the comparator logic.

4. The standard cell according to claim 1, wherein the comparator logic has an output to output a comparison signal, the output of the comparator logic being connected to an output of the standard cell.

5. The standard cell according to claim 1, further comprising an output driver, which is connected to the slave flip-flop and a data output of the standard cell.

6. The standard cell according to claim 1, wherein the comparator logic represents a first OR operation whose inputs are connectable to inputs of the comparator logic, and a second OR operation whose inputs are connectable to the inputs of the comparator logic, and a NAND operation whose inputs are connectable to an output of the first OR operation and to an output of the second OR operation, the output of which is connectable to an output of the comparator logic.

7. An integrated circuit comprising:
a standard cell comprising:
   a master-slave flip-flop; and
   a comparator logic having inputs adapted to receive an input signal of the master-slave flip-flop, an inverted input signal of the master-slave flip-flop, an output signal of the master-slave flip-flop, and an inverted output signal of the master-slave flip-flop,
   wherein the master-slave flip-flop has a master flip-flop and a slave flip-flop,
   wherein the slave flip-flop has a first inverting element and a second inverting element,
   wherein, for feedback, an output of the first inverting element is connectable to an input of the second inverting element and an output of the second inverting element is connectable to an input of the first inverting element, and
   wherein, to output the output signal and the inverted output signal of the master-slave flip-flop, the output and the input of the second inverting element are connectable to inputs of the comparator logic so that the second inverting element and the comparator logic and an additional inverter form an exclusive-OR operation of the standard cell;
a clock gate circuit; and
a clock switching logic;
   wherein an output of the standard cell is connectable to the comparator logic of the standard cell to output a comparison signal in a case of a different input and output signals of the master-slave flip-flop is connected to an input of the clock switching logic, and
   wherein the output of the clock switching logic is connectable to a control input of the clock gate circuit to switch a clock to a clock input of the standard cell based on the comparison signal.

8. The integrated circuit according to claim 7, wherein the integrated circuit is configured to perform a test function, wherein the standard cell has a test input and a data input, and wherein the standard cell has a multiplexer connectable to the test input and the data input for switching to the test input for the test function, wherein the multiplexer has an output connectable to an input of the master-slave flip-flop and an input of the comparator logic.

* * * * *